United States Patent
Hikmet et al.

(10) Patent No.: US 10,551,032 B2
(45) Date of Patent: Feb. 4, 2020

(54) LIGHTING ASSEMBLY WITH A UV PROTECTED LIGHT SOURCE THAT EMITS VISIBLE LIGHT

(71) Applicant: SIGNIFY HOLDING B.V., Eindhoven (NL)

(72) Inventors: Rifat Ata Mustafa Hikmet, Eindhoven (NL); Ties Van Bommel, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 42 days.

(21) Appl. No.: 15/745,286

(22) PCT Filed: Jun. 27, 2016

(86) PCT No.: PCT/EP2016/064858
§ 371 (c)(1),
(2) Date: Jan. 16, 2018

(87) PCT Pub. No.: WO2017/012829
PCT Pub. Date: Jan. 26, 2017

(65) Prior Publication Data
US 2018/0209609 A1    Jul. 26, 2018

(30) Foreign Application Priority Data
Jul. 23, 2015    (EP) ..................................... 15177988

(51) Int. Cl.
*F21V 3/00* (2015.01)
*F21V 5/00* (2018.01)
*F21V 9/06* (2018.01)
*F21K 9/233* (2016.01)

(52) U.S. Cl.
CPC ................. *F21V 9/06* (2013.01); *F21K 9/233* (2016.08)

(58) Field of Classification Search
CPC ......... F21K 9/00–0233; F21K 9/60–69; F21V 9/00–45; H01L 25/00–0753; H01L 33/44–504
USPC .................. 257/98–103; 362/249.02, 311.02
See application file for complete search history.

(56) References Cited

U.S. PATENT DOCUMENTS

| | | | |
|---|---|---|---|
| 8,164,102 | B2 | 4/2012 | Furukawa et al. |
| 2011/0133672 | A1 | 6/2011 | Tsang et al. |
| 2015/0014715 | A1 | 1/2015 | Hsing Chen et al. |

FOREIGN PATENT DOCUMENTS

CU    203810092 U    9/2014

*Primary Examiner* — Jason M Han
(74) *Attorney, Agent, or Firm* — Daniel J. Piotrowski

(57) ABSTRACT

A lighting assembly (1000), a lamp and a luminaire are provided. The lighting assembly comprises a first light source (110), a second light source (108) and an UV filter (104). The first light source emits in operation visible light (112). The second light source emits in operation UV light (108). The UV filter allows a transmission of visible light and absorbs or reflects UV light. The UV filter is arranged in an optical path from the second light source towards the first light source to prevent the UV light to impinge on the first light source while allowing the emission of the UV light into the ambient of the lighting assembly.

15 Claims, 6 Drawing Sheets

LIGHTING ASSEMBLY WITH A UV PROTECTED LIGHT SOURCE THAT EMITS VISIBLE LIGHT

CROSS-REFERENCE TO PRIOR APPLICATIONS

This application is the U.S. National Phase application under 35 U.S.C. § 371 of International Application No. PCT/EP2016/064858, filed on Jun. 27, 2016, which claims the benefit of European Patent Application No. 15177988.1, filed on Jul. 23, 2015. These applications are hereby incorporated by reference herein.

FIELD OF THE INVENTION

The invention relates to a lighting assembly.
The invention further relates to a lamp, a retrofit light bulb, a retrofit light tube and a luminaire.

BACKGROUND OF THE INVENTION

Published Chinese document CN203810092U discloses a detection lamp that can be used to detect cracks. In operation, the lamp emits visible light and UV light. In particular the UV light is used to detect cracks in objects that are illuminated by the detection lamp. Inside the lamp, in a chamber that comprises a light exit window, different Light Emitting Diodes (LEDs) are provided. At least one LED emits the UV light and at least one LED is configured to emit white light. The LEDs are provided with lenses and are arranged to emit the light into the chamber and such that it can be emitted into the ambient through the light exit window. Is has been found that the life span of the crack detection lamp is relatively short. The quality of the light source that emits white light degrades too fast.

SUMMARY OF THE INVENTION

It is an object of the invention to provide a lighting assembly emitting visible light and UV light that has a longer life span.

For this purpose, according to an aspect of the invention, a lighting assembly is provided. For this purpose, according to other aspects of the invention, a lamp, a retrofit light bulb and a retrofit light tube are provided.

According to one aspect of the invention, a lighting assembly comprising a first light source, a second light source and an UV filter. The first light source is for emitting visible light. The second light source is for emitting UV light. The UV filter is for allowing a transmission of visible light and for absorbing or reflecting UV light. The UV filter is arranged in an optical path from the second light source towards the first light source for absorbing or reflecting UV light that follows a path from the second light sources towards the first light source. This arrangement of the UV filter in this optical path prevents that the UV light impinges on the first light source while it allows the emission of the UV light into the ambient of the lighting assembly. Optionally, the first light source is capable of emitting visible light having a color point in the CIE XYZ color space within a distance smaller than 25 Standard Deviation Color Matching (SDCM) to the black body line in said color space. The lighting assembly emits visible light that is well-suitable for illumination.

The first light emitting element is capable of emitting relatively white light which is in particular suitable for illumination. In specific embodiment, the first light emitting element may comprise controllable light emitters emitting different colors. In this specific embodiment it is possible to control the light emitters to emit a mix of the different colors that has the color point, as defined in the optional embodiment, relatively close to the black body line. In another embodiment, the first light emitting element always emits, in operation, the visible light having the color point within the defined maximum distance of 25 SDCM to the black body line. In other words, when the first light emitting element is capable of emitting the visible light having the defined color point, it is not necessary that the first light emitting element always emits such light, but it means that the first light emitting element is at least in one operational mode capable of emitting the light with such a color point.

As defined by the distance to the black body line, the visible light may be exactly white light or slightly off-white light. Within these specific situations, the visible light is still relatively white to obtain a good illumination of the space and, for example, to have a relatively good color rendering. It is to be noted that, in specific embodiments, the visible light has a color point within 7 SDCM, or 5 SDCM, from the black body line. The visible light is emitted by the first light emitting element. It is to be noted, as will be discussed later in this document, that the first light emitting element may be a first light source or may comprise one or more luminescent materials, which converts the UV light to the visible light.

The light assembly also emits UV light. Thus, not only the visible light illuminates the environment, in which the lighting assembly is operated, the UV light also illuminates the environment. Thus, specific wavelengths of UV light may be emitted that are in specific application useful, for example, wavelengths that stimulate Vitamin D production by the human skin. Then the emitted UV light assists in obtaining a specific health effect. In other embodiments specific UV wavelengths may be emitted that are used for treating specific skin diseases of a person being present in the space that is illuminated by the lighting assembly.

The UV filter protects the first light source against UV light. The inventors have found that many types of light sources degrade under the influence of UV light, for example, their performance reduces over time or their mechanical structure becomes weaker. Thereby too early malfunctioning of the lighting assembly is prevented and the life span of the lighting assembly is increased. It is to be noted that the UV filter may absorb or reflect a significant part of the UV light that impinges on the filter. It is known that not every filter is perfect and that the UV filter may still allow a transmission of a small part of the UV light that impinges on the UV filter. For example, the UV filter still transmits up to 20% of the UV light that impinges on the UV filter through the UV filter. In another embodiment, the UV filter still transmits up to 10% of the UV light that impinges on the UV filter through the UV filter. In a further embodiment, the UV filter still transmits up to 5% of the UV light that impinges on the UV filter through the UV filter. In another further embodiment, the UV filter still transmits up to 1% of the UV light that impinges on the UV filter through the UV filter.

Optionally, the second light source and/or the first light source are a solid state light emitter such as, for example, a Light Emitting Diode (LED), an Organic Light Emitting diode (OLED), or, for example, a laser diode. It has been found that solid state light emitters (which emit visible light) degrade too fast when UV light impinges on them. By providing the UV filter, the life span of solid state light emitter that emits the visible light is extended.

Optionally, the UV filter surrounds or encloses the first light source. Optionally, the second light source is not surrounded or enclosed by the UV filter. It has to be noticed that the first light source may be provided on a support board and, thus, at least one surface of the first light source does potentially not received the UV light. As well for surrounding as for enclosing, it has been assumed that this relates to the surfaces of the first light source that may receive UV light when the UV filter would not be present. The term surrounding indicates that around about the whole first light source (except the areas where it is provided on a support) the UV filter is provided and that a gap may be present between the UV filter and the first light source. The term enclosing indicates that at about all surfaces of the first light source (except the surfaces that are in direct contact with e.g. a support) the UV filter is provided, in other words, the first light source is adjacent to the UV filter. When the UV filter surrounds or encloses the first light source, it is effectively prevented that the UV light reaches the first light source. When the UV filter encloses the first light source, a relatively small amount of material has to be used for the UV filter and an unnecessary distortion of UV light transmission paths is prevented (thereby maintaining the efficiency of the lighting assembly with respect to UV light relatively high).

Optionally, the first light comprises a solid state light emitter package comprising a solid state light emitter for emitting visible light, the solid state light emitter package being enclosed by the UV filter. The solid state light emitter package comprises, for example, a support board for the solid state light emitter and/or some light transmitting Silicone provided on the solid state light emitter and/or an optical element for spreading or collimating the light emitted by the solid state light emitter, wires for connecting the solid state light emitter to external power pins or pad of the package, etc. Often, solid state light emitters are sold in such packages—they are easy to handle and easy to mount in lighting assemblies. It is effective and efficient to provide the UV filter on the outside surfaces of such a solid state light emitter package thereby enclosing the package with the UV filter. It has to be noted that the solid state light emitter package may be provided on a support board and that, consequently, one of its surfaces is already protected against UV light. In such cases enclosing means that the UV filter is provided on the surfaces of the packages that are not in direct contact with the support board.

Optionally, the UV filter allows a transmission of oxygen towards the second light source. In general the lighting assembly is used in a space where oxygen is available. As discussed above, the UV light may result in a degradation of the first light source, and the inventors have found that a lack of oxygen may also degrade specific components of the first light source such as, for example, light transmitting Silicone rubber that is often used in solid state light emitter packages. Thus, to prevent such a degradation of Silicone rubber, the UV filter may be at least partly permeable for oxygen.

Optionally, the lighting assembly comprises a housing. A light exit window is provided in a wall of the housing for allowing, in operation, the emission of the visible light and the UV light into an ambient of the lighting assembly. A light mixing chamber is provided in the interior of the housing for mixing the light emitted by the first light source and the second light source before being transmitted through the light exit window. The first light source and the second light source are provided in the light mixing chamber. The light mixing chamber assist in obtaining a uniform light output along the light exit window. In particular when the first light source comprises a plurality of light sources for emitting different colors of light and when the combination of the different colors of light may result in the visible light having the above defined color point, it is useful to mix the colors of light such that a uniform color output is obtained through the light exit window. As the result of the mixing, the UV light is also emitted in a relatively uniform distribution across the light exit window and, thus, is the irradiance of the UV light at the light exit window relatively low thereby preventing possible damage to users in misuse situations (e.g. when the light exit window is brought in contact with human skin).

Optionally, the first light source is arranged on a wall of the light mixing chamber opposite to the light exit window for emitting the visible light directly towards the light exit window. One or more surface of the first light source not in contact with the wall are provided with the UV filter. Optionally, the second light source is arranged at a position inside the light mixing chamber such that the second light source does not directly emit the UV light through the light exit window—in other words it a direct emission of the UV light through the light exit window is prevent. Thus, the UV light is at least reflected once for obtaining a better homogeneous output of the UV light along the light exit window and preventing high irradiance peaks of the UV light at specific locations of the light exit window.

Optionally, the lighting assembly comprises one or more first light sources. Optionally, the lighting assembly comprises one or more second light sources. Optionally, the lighting assembly comprises one or more UV filters. The transmission of UV light along optical path(s) from the one or more second light sources towards the one or more first light sources is blocked by the one or more UV filters. The advantage of using a plurality of (first) light sources is that a larger light output volume can be obtained. Then all first light sources must be protected against the UV light. One UV filter may surround all first light sources. Or a plurality of UV filters may be used, for example, surrounding or enclosing different groups of first light sources or each first light source is provided with an UV filter.

According to an aspect of the invention, the lighting assembly comprises a light exit window. The lighting assembly is configured to emit, in operation, an amount of UV light through the light exit window. The amount of UV light has a first radiant flux. The lighting assembly is also configured to emit a second radiant flux of visible light through the light exit window. A ratio between the first radiant flux and the second radiant flux is in a range from 0.01 to 0.0001. When the lighting assembly is used for general illumination, the UV light is also emitted into spaces where humans or animals are present. There is a prejudice to exposing humans to artificial UV light. Despite the prejudice, the inventors have found a lighting assembly that emits a combination of UV light and visible light and that is suitable for illumination. The inventors of the lighting assembly have carefully considered the possible health risks and possible health benefits such as Vitamin D production by the human skin when receiving UV light. They have found which UV light is suitable for this application and they have found an advantageous range of ratios between the emitted UV light and the emitted visible light, in which the health benefits certainly outweigh possible risks. Optionally, the ratio is in between 0.005 and 0.0001. Optionally, the ratio is in between 0.001 and 0.0001.

Optionally, the UV light comprises light in a spectral range from 280 nm to 400 nm. Optionally, the UV light comprises light in a spectral range from 280 nm to 350 nm. When the lighting assembly is used for general illumination, the UV light is also emitted into spaces where humans or animals are present. Humans, who are in this environment, receive a specific amount of UV light in the spectral range from 280 nm to 400 nm or 350 nm. This spectral range comprises the so-termed UV-b spectral range (280 nm-315 nm). Humans, who do not receive any natural sunlight on their skin, often lack a large enough Vitamin D production—the UV light in the spectral range stimulates the production of Vitamin D in the human skin and, as such, health benefits are obtained. Optionally, the second light source emits in use at least 75% of the emitted UV radiation in the spectral range from 280 nm to 400 nm. Optionally, the second light source emits in use at least 65% of the emitted UV radiation in the spectral range from 280 nm to 350 nm.

According to an aspect of the invention, a lamp for illumination is provided, which comprises one of the above discussed lighting assemblies. In summary, such a lamp can be used to illuminate a space such that the humans that are present in this space receive visible light and UV light. The lamp has a longer life span. The lamp has similar embodiments, effects and advantages as the lighting assembly.

According to an aspect of the invention, a retrofit light bulb for illumination is provided. The retrofit light bulb comprises a light transmitting bulb and one of the above discussed lighting assemblies. According to an aspect of the invention, a retrofit light tube for illumination is provided. The retrofit light tube comprises a light transmitting tube and one of the above discussed lighting assemblies. The retrofit light bulb and the retrofit light tube can be used in luminaires that are designed to use traditional light bulbs and traditional (fluorescent) light tube. Thereby, it is possible to retrofit those luminaries with light sources that emit UV light and visible light simultaneously. The life span of the retrofit light bulb and of the retrofit light tube is relatively long. The retrofit light bulb and the retrofit light tube may have embodiments, effects and advantages similar to the embodiments, effect and advantages of the above discussed lighting assemblies.

According to an aspect of the invention, a luminaire for illumination is provided. The luminaire comprises one of the above discussed lighting assemblies, the above discussed lamp, the above discussed retrofit light bulb or the above discussed retrofit light tube. The luminaire has similar embodiments, effects and advantages as the embodiments, effect and advantages of the lighting assembly, the lamp, the retrofit light bulb and/or the retrofit light tube.

Further preferred embodiments of the device and method according to the invention are given in the appended claims, disclosure of which is incorporated herein by reference.

BRIEF DESCRIPTION OF THE DRAWINGS

These and other aspects of the invention will be apparent from and elucidated further with reference to the embodiments described by way of example in the following description and with reference to the accompanying drawings, in which FIG. 1a schematically shows in a cross-sectional view an embodiment of a lighting assembly, FIG. 1b schematically shows in a cross-sectional view another embodiment of a lighting assembly, FIG. 2a schematically shows in a cross-sectional view a further embodiment of a lighting assembly, FIG. 2b schematically shows in a cross-sectional view another embodiment of a lighting assembly, FIG. 3a schematically shows in a cross-sectional view an embodiment of lighting assembly that comprises a light mixing chamber, FIG. 3b schematically shows in a cross-sectional view another embodiment of lighting assembly that comprises a light mixing chamber, FIG. 4a schematically shows in a cross-sectional view a further embodiment of lighting assembly that comprises a light mixing chamber, FIG. 4b schematically shows a CIE XYZ color space, FIG. 5a schematically shows in a cross-sectional view an embodiment of a retrofit light bulb, FIG. 5b schematically shows in a cross-sectional view an embodiment of a retrofit light tube, and FIG. 6 schematically shows a luminaire.

The figures are purely diagrammatic and not drawn to scale. In the Figures, elements which correspond to elements already described may have the same reference numerals.

DETAILED DESCRIPTION OF EMBODIMENTS

Figure 1A:
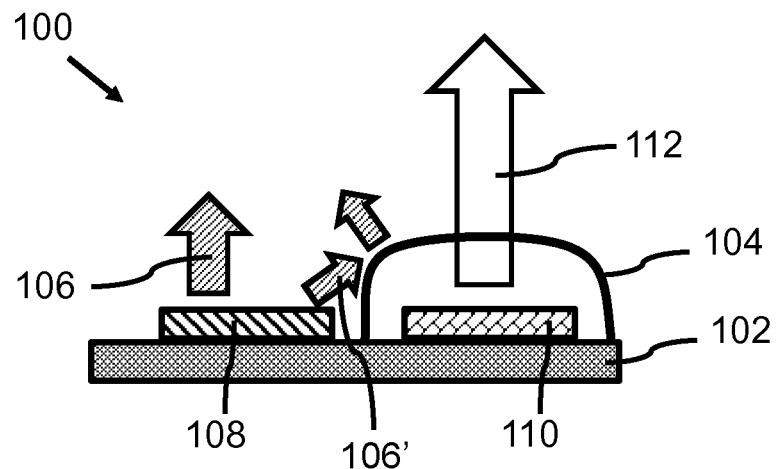

FIG. 1a schematically shows in a cross-sectional view an embodiment of a lighting assembly 100. The lighting assembly comprises a support panel 102 on which a first light source 110 and a second light source 108 are provided. The first light source is capable emitting, in operation, visible light 112. Optionally, the visible light 112 has a color point in a CIEXYZ color space at a maximum distance of 25 SDCM from a black body line in that color space. The second light source 108 emits, in operation, UV light 106, 106'. The lighting assembly 100 further comprises a UV filter 104. The UV filter 104 absorbs UV light that impinges on the UV filter or reflects, as shown in FIG. 1a, the UV light 106' impinging on the UV filter 104. In other words, UV light 106, 106' is not transmitted through the UV filter 104. The UV filter 104 is capable of transmitting the visible light 112, in other words, the visible light 112 is at least partially transmitted through the UV filter 104. At an optical path from the second light source 108 to the first light source 110 the UV filter 104 is arranged such that no UV light impinges on the first light source 110. A portion of the UV light 106' is emitted towards the first light source 110, however, because of the UV filter 104, this light is reflected into another direction and, thus, the UV light 106' does not arrive at the first light source 110. Thereby it is prevent that the first light source is damaged (on the middle long or long term) by the UV light.

The term surrounding indicates that around about the whole first light source (except the areas where the first light source is provided on a support) the UV filter is provided and that a gap may be present between the UV filter and the first light source. The gap may be filled with air, or another gas, or another light transmitting material, either in the gaseous phase, the solid phase or the liquid phase. The term enclosing indicates that at about all surfaces of the first light source (except the surfaces that are in direct contact with e.g. a support) the UV filter is provided, in other words, the first light source is adjacent to the UV filter. When the UV filter surrounds or encloses the first light source, it is effectively prevented that the UV light reaches the first light source. When the UV filter encloses the first light source, a relatively small amount of material has to be used for the UV filter and an unnecessary distortion of UV light transmission paths is prevented (thereby maintaining the efficiency of the lighting assembly with respect to UV light relatively high).

Figure 4A:
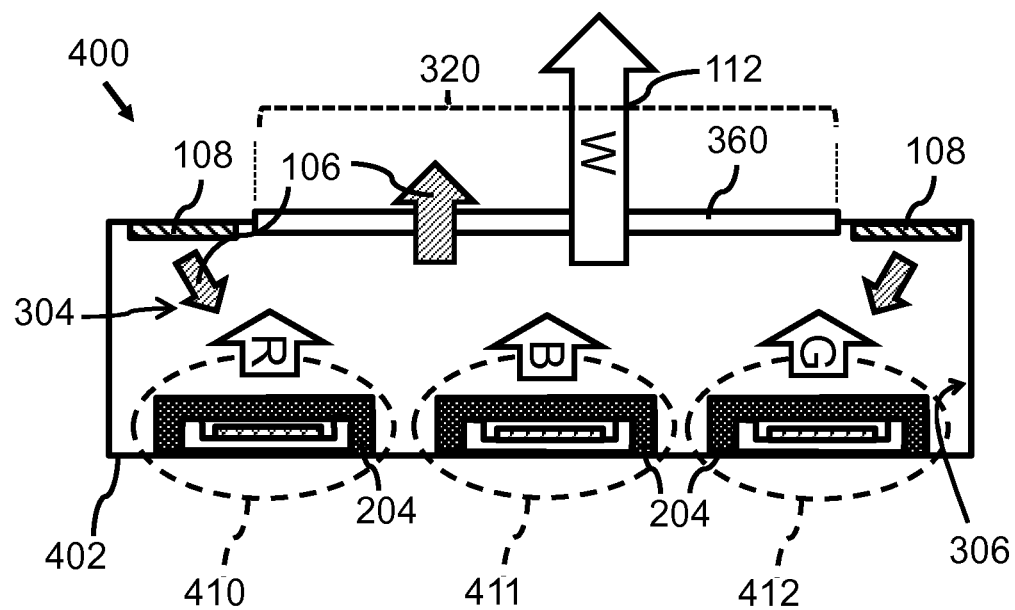
Figure 4B:
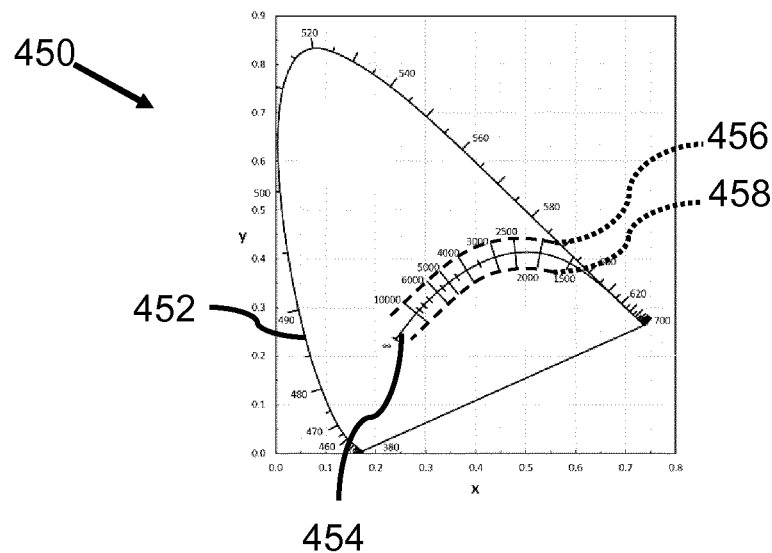

FIG. 4b presents a CIE XYZ color space 450, in which an area between lines 456 and 458 is indicated, where a color point of the visible light may be located. In the CIE XYZ color space 450, a line 452 is drawn, which represents the color point of light of a single wavelength. Also a black body line 454 is drawn. The black body line 454 represents color points of electromagnetic radiation emitted by black bodies having a specific temperature. In general, light with color points on the black body line 454 are experienced by humans as substantially white light. Light, at a maximum distance of 25 SDCM, is still experienced by the human naked eye as relatively white with a slight color tint. The area, with a maximum distance of 25 SDCM, is schematically indicated in FIG. 4*b* as the area between lines 456 and 458.

In the above description, the first light source 110 and the second light source 108 are introduced. The second light source 108 and/or the first light source 110 may be a solid state light emitter such as, for example, a Light Emitting Diode (LED), an Organic Light Emitting diode (OLED), or, for example, a laser diode.

It is further to be noted that in the context of FIG. 1*a* one first source 110, one second source 108 and one UV filter 104 are drawn. In practical embodiments, the lighting assembly 100 may comprise one or more first light sources 110, one or more second light sources 108 and one or more UV filters 104. Additionally, the first light source may comprise a light emitter that emits a specific color of light and one or more luminescent materials that partly convert the light of the specific color of light towards light of one or more other colors. Moreover, the first light source 110 may comprise a plurality of light emitters that each emit, for example, a primary color and in at least one operation mode the emitted mix of primary colors forms the visible light having the defined color point. For example, the first light source 110 may comprises a first red emitting LED, a second blue emitting LED and a third green emitting LED. Such LEDs emitting a primary color may be controlled with individual control signals such that the obtained color combination has a specific color point. In the context of this document it is important that the lighting assembly is at least able to emit the visible light having a color point with the above defined maximum distance of 25 SDCM to the black body line. It is not necessary that the lighting assembly always emits the visible light having that color point, but at least emits such light in response to control signal(s) requesting such color point.

The lighting assembly 100 emits visible light 112 that is well-suitable for illumination because it is capable of emitting relatively white light (because the visible light 112 has a color point within a limited distance of 25 SDCM from the black body line). As defined by the distance to the black body line, the visible light 112 may be off-white light. For example, in specific situations, it is useful to emit bluish white light because it helps people to be more productive, or in other situations, it is useful to emit greenish white light because it helps people to feel more relaxed. The visible light 112 is still relatively white to obtain a good illumination of the space and, for example, to have a relatively good color rendering. It is to be noted that, in a specific embodiment, the visible light 112 has a color point within 7 SDCM, or 5 SDCM, from the black body line. Optionally, the visible light 112 having a color point within 25 SDCM from the black body line has a correlated color temperature in a range from 2000 to 20000 Kelvin, or in between 2500 and 10000 Kelvin, or even in between a smaller range of 2700 to 6000 Kelvin. In general, visible light has wavelengths in a range from 400 nm to 800 nm. The light emission distribution of the visible light 112 may have some tails outside this range and, optionally, at least 90% of all light, emitted by the first light emitting element, is in the range from 400 nm to 800 nm. Optionally, the Color Rending Index of the visible light 112 is at least 60, or at least 70. Optionally, the visible light 112 has a relatively high CRI, for example, at least 80, or at least 85.

The light assembly 100 also emits UV light 106, 106'. Thus, not only the visible light 112 illuminates the environment in which the lighting assembly 100 is operated, the UV light 106 also illuminates the environment. Optionally, the spectral range of the UV light 106, 106' may be limited to the range from 280 nm to 350 nm and, thus, humans, who are in this environment, receive a specific amount of UV light 106 in the spectral range from 280 nm to 350 nm. This UV light 106 stimulates the production of Vitamin D in the human skin and, as such, health benefits are obtained. Optionally, in operation, the second light source 108 emits a first radiant flux of the UV light 106 and the first light emitting element emits a second radian flux of visible light 112. A ratio between the first radiant flux and the second radiant flux is in a range from 0.01 to 0.0001. Thus, the amount of emitted UV light 106 is relatively low compared to the amount of emitted visible light 112. Thereby, it is prevented that human skin receives too much UV light 106, resulting is possible health risks. The second light source 108 may emit UV light in, for example, the above defined spectral range. It is possible that the light distribution of the second light source 108 has tails outside the above discussed spectral range and optionally, at least, 75% of the light energy emitted by the second light source 108 is emitted in the spectral range. Optionally, the second light source emits UV light 106 in a range from 290 nm to 340 nm, and, at least, 65% of the light energy emitted by the second light source 108 is emitted in this range from 290 nm to 340 nm. Optionally, the second light source emits UV light 106 in a range from 295 nm to 335 nm, and, at least, 60% of the light energy emitted by the second light source 108 is emitted in this range from 295 nm to 335 nm. Optionally, the second light source emits UV light 106 in a range from 300 nm to 320 nm and at least 55% of the radiant flux emitted by the second light source 108 is emitted in the range from 300 nm to 320 nm. In particular, when the second light source 108 mainly emits UV-b light and the UV-b light is, optionally, concentrated in a relatively small range (e.g. ±5 nm) around 310 nm, the most effective UV light is emitted for stimulating the Vitamin D production by the human skin, and other forms of possibly harmful UV light are not emitted.

As discussed above in the optional embodiment, the amount of UV light 106 emitted is relatively small compared to the amount of visible light 112 emitted. This has been defined by means of a ratio of the first radiant flux of the UV light 106 (in the spectral range) and the second radiant flux of the visible light 112. In this context, radiant flux is the radiant energy transmitted into the ambient. The SI unit of radiant flux is watt (W). Radiant fluxes can be measured by means of a calibrated power meter. The calibrated power meter and the lighting assembly may be placed in an integrating sphere for obtaining a reliable measurement. The power meter or the spectrometer may use filter or gratings to distinguish between different wavelengths. For example, a measurement is performed when the power meter is equipped with a filter which allows the emission of light in between 280 nm and 350 nm. Or, for example, several measurements are used which allow the transmission of different, smaller, ranges and the results of the different measurements are combined to one result. The radiant fluxes may be measured under different operational conditions, for example, when the lighting assembly is controlled to operate at full power and, for example, when the lighting assembly is controlled to operate at 50% of its maximum power. In an embodiment, the first radiant flux and the second radiant flux are determined under predefined operational conditions. The predefined operational conditions are, for example, the conditions that are defined by the manufacturer of the different light emitting components as the ideal conditions to operate the light emitting components. The predefined operational conditions may comprise, at least one of a predefined current provided to the light emitting components, and a predefined voltage provided to the light emitting components, and may also include predefined environmental conditionals like the ambient temperature. In the above discussed embodiment, the ratio between the first radiant flux and the second radiant flux is in between 0.01 and 0.0001. Optionally, the ratio is in between 0.005 and 0.0001. Optionally, the ratio is in between 0.001 and 0.0001.

The lighting assemblies, the lamp, the light bulb and the light tube of this document are for illumination. In the context of this document, "illumination" must be considered as "general illumination", which means, it is not the illumination of an environment or a product with another specific non-illumination purpose (killing bacteria, growing plants, detecting cracks, medical treatment, tanning) than just illuminating it. It means that when a space is too dark for people to work/live in, and its illumination level must be raised, the embodiments of this document can be used for the purpose of increasing the illumination level of that space such that it is convenient for people to live and work in that space. In practical embodiments, the lighting assemblies, the lamps, the light bulb, the light tube are capable of emitting at least 300 lumens of light. In practical embodiments, the lighting assemblies, the lamps, the light bulb, the light tube are capable of emitting not more than 2000 lumens of light. Sometimes the light exit window is medium sized (e.g. when a multitude of light sources are used in one lighting assembly). In such cases the light exit window is in between 30 to 300 cm$^2$. In such cases the light output is in between 1000 and 5000 lumens. Luminaries have, in general, also a light output in between 1000 and 5000 lumens of light and their luminaire light output window has often predefined fixed sizes, for example, 50×50 cm, 60×60 cm or 60×120 cm. Thus the luminaire light output windows are in general in between 2500 cm$^2$ and 7200 cm$^2$.

Above discussed characteristics and embodiments of the UV light 106, the visible light 112, the second light source 108 and the first light emitting element 110 do also apply to the same type of elements of the embodiments of FIGS. 1b to 4a, 5a and 5b unless stated otherwise.

Figure 1B:
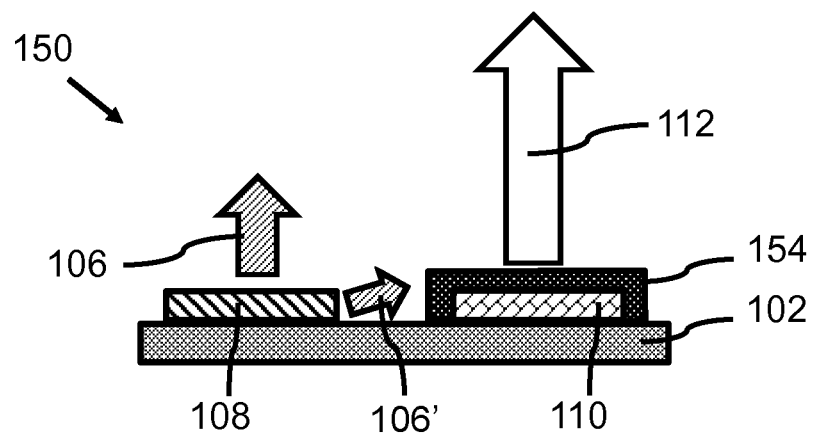

FIG. 1b schematically shows in a cross-sectional view another embodiment of a lighting assembly 150. The lighting assembly 150 is similar to lighting assembly 100 of FIG. 1a. A difference is that the UV filter 104 of FIG. 1a is replaced by the UV filter 154. The UV filter 254 encloses the first light source 110, thus, the UV filter 254 is brought in direct contact with surfaces of the first light source 110 and, more in particular, the surfaces of the first light source 110 on which the UV light 106, 106' may impinge. Another difference is that the UV filter 254 is, in this specific embodiment, a UV filter that absorbs the UV light 106' that impinges on the UV filter 154. Inorganic UV absorbers such as ZO,TiO$_2$ and organic uv absorbers such as (Cetiol® Sensoft, BASF), isopropylpalmitate (BASF), caprylic/capric triglyceride (Myritol® 318, BASF), cocoglycerides (Myritol® 331, BASF), alcohol (96% ethanol, Fluka), phenoxyethanol (Protectol PE, BASF), sodium stearoyl glutatmate (Emulgin® SG, BASF), polyamide-5 (Orgasol Caresse, Arkema), xanthan gum (Keltrol CG RD, CP Kelco), distarch phosphate (Mais PO4PH»B«, Agrana Starke GmbH), sodium acrylates copolymer (and) hydrogenated polydecene (and) PPG-1 trideceth-6 (Tinovis® ADE, BASF), acrylates/beheneth-25 methylacrylate copolymer (Tinovis® GTC, BASF), disodium EDTA (Edeta® BD, BASF), and sodium hydroxide (30% in water, Fluka). Further solid UV absorbers employed were diethylhexyl butamido triazone, DBT (Uvasorb® HEB, 3V Sigma), Bis-ethylhexyloxyphenol methoxyphenyl triazine, BEMT (Tinosorb® S, BASF), methylene bisbenzotriazolyl tetramethylbutylphenol, MBBT (and) aqua (and) decyl glucoside (and) propylene glycol (and) xanthan gum (Tinosorb® M, BASF), and tris biphenyl triazine, TBPT (Tinosorb® A2B, BASF). Of course the UV filter 254 may also be a dichroic reflector.

Figure 2A:
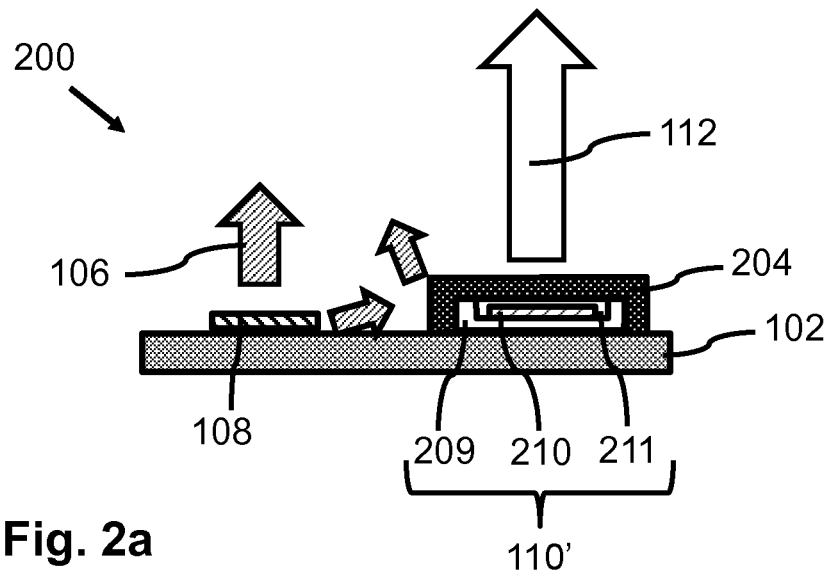

FIG. 2a schematically shows in a cross-sectional view a further embodiment of a lighting assembly 200. The lighting assembly 200 is similar to lighting assembly 150. The UV filter 154 of FIG. 1b is replaced by UV filter 204. The UV filter 204 acts as a dichroic mirror: the visible light 112 is transmitted through the UV filter 204 and the UV light 106' impinging on the UV filter 204 is reflected and, thus, not transmitted towards the first light source 110'. Another different between lighting assembly 150 and lighting assembly 200 is the first light source. In lighting assembly 200 a first light source 110' is provided that comprises a solid state light emitter packages. The first light source 110' comprises package housing 209 which partially encloses a space in which a solid state light emitter 210 (e.g. a LED) is provided and which space is further filled with a light transmitting material 211 (e.g. Silicone). Optionally the light transmitting material 211 comprises one or more luminescent materials for at least partially converting the light generated by the solid state light emitter 210 to light of a different wavelength range. In the solid state light emitter package the solid state light emitter is electrically coupled to power pins (not shown) or power reception areas (now shown) by means of, for example, bonded wires (not shown). The solid state light emitter package may also comprise means (not shown) to distribute the heat generated by the solid state light emitter 210 towards the support panel 102 of the lighting assembly. It is to be noted that the solid state light emitter package has a specific shapes, but different shapes are possible as well, for example, the package housing 209 may be cup-shaped, or the recess in the package housing 209 may be cup-shaped. Also the provided light transmitting material may have other shapes, like the shape of a lens. The current invention is not limited to the shown and mentioned shapes of the solid state light emitter package and other appropriate shapes are possible as well. In this optional embodiment, the UV filter 204 protects the whole solid state light emitter package against a possible harmful influence of the UV light 106, 106'. Dichoric filters are produced by using layers of dielectric materials such as magnesium fluoride, calcium fluoride, and various metal oxides, which are deposited onto the optical substrate materials.

Figure 2B:
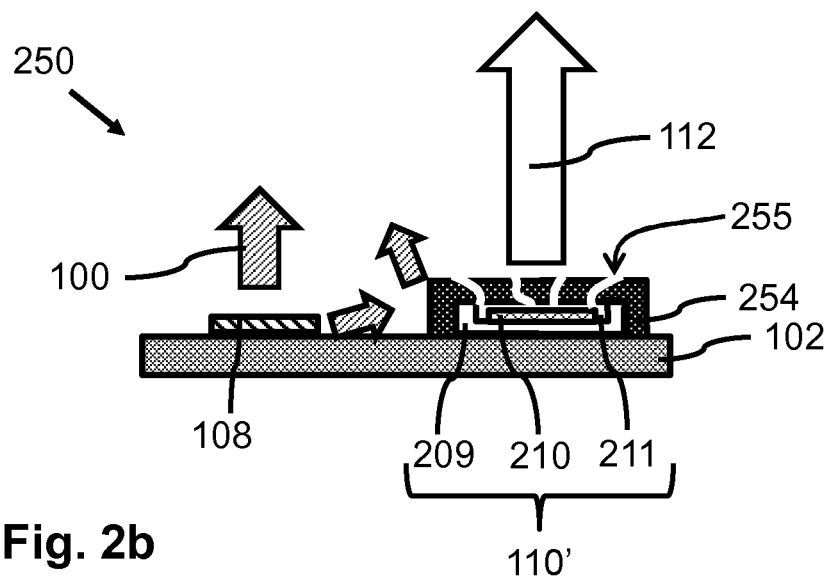

FIG. 2b schematically shows in a cross-sectional view another embodiment of a lighting assembly 250. The lighting assembly 250 is similar to the lighting assembly 200 of FIG. 2a. A difference is that the UV filter 204 of lighting assembly 200 has been replaced by the UV filter 254. The UV filter 254 has similar optical characteristics as the UV filter 204 of FIG. 2a and at least an important difference is that the UV filter 254 allows the transmission of oxygen towards the first light source 110'. In FIG. 2b channels 255 are schematically drawn to indicate that the UV filter 254 is at least partly permeable for oxygen, however, it is not necessary that the UV filter 254 has channels to allow the transmission of oxygen towards the first light source 110'. Inorganic and organic UV absorbers described above are dispersed/dissolved in a polymer matrix such as silicone rubber, polycarbonate. This way oxygen permeable UV absorbing layers are formed. Permeability values of common polymers are known in the literature. By allowing oxygen to go through disadvantageous effects of UV such as coloring of plastics can be reversed by oxygen induced bleaching reactions.

Figure 3A:
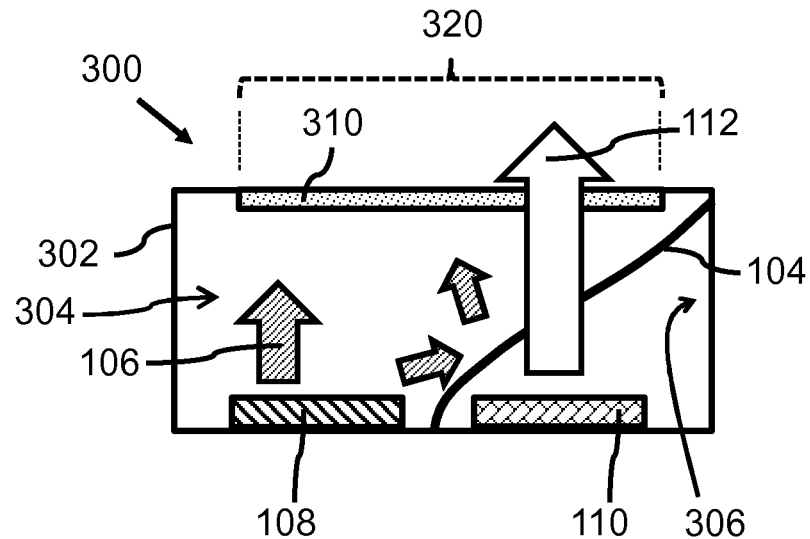

FIG. 3a schematically shows in a cross-sectional view an embodiment of lighting assembly 300 that comprises a light mixing chamber 304. The lighting assembly 300 comprises a housing 302 that has in a wall a light exit window 320. The housing encloses the light mixing chamber 304. In the specific embodiment of FIG. 3a, the light exit window 320 is provided with a light transmitting diffusor 310, however, other light transmitting optical elements may also be provided at the light exit window 320. The light generated and mixed in the light mixing chamber 304 may be emitted through the light exit window 320 into the ambient of the lighting assembly 300. Inner walls 306 of the housing 302 may be light reflective. The inner walls 306 may be reflective for the visible light 112 and for the UV light 106. The inner walls 306 may be specularly reflective or diffusely reflective. At an inner wall of the housing 302, which is the inner wall opposite to the light exit window 320, are provided a first light source 110 and a second light source 108. Embodiments of the first light source 110 and the second light source 108 are discussed in the context of previous embodiments, for example the embodiments of FIG. 1a to FIG. 2b. At an optical path from the second light source 108 to the first light source 110 is provided a UV filter 104. Embodiments of the UV filter 104 are discussed previously, for example in the context of the embodiments of FIG. 1a to FIG. 2b. UV Light emitted by the second light source 108 is not transmitted towards the first light source 110 because the UV filter 104 absorbs and/or reflects the UV light that impinges on the UV filter 104. Visible light 112 generated by the first light source 110 is emitted through the UV filter, through the light exit window, into the ambient of the lighting assembly 300. Thereby, about no UV light 106 impinges on the first light source 110 and, consequently, the quality first light source 110 is not deteriorated because of the damaging character of the UV light. The light mixing chamber 104 may reflect portions of the visible light 112 and the UV light 106 one or more times and thereby a more uniform light output is obtained along the light exit window 320 and, thereby, the irradiance levels of the UV light 106 along the light exit window are reduced. The diffusor 310 also contributes to a more uniform light output and the prevention of high irradiance levels of UV light 106. High irradiance levels of UV light 106 at the light exit window may be dangerous, in particular during misuse when, for example, a user brings lighting assembly 300 in contact with his skin or bring the light exit window directly in front of his eyes. Thus, the light mixing room 304 contributes to an additional safety of the lighting assembly 300.

Figure 3B:
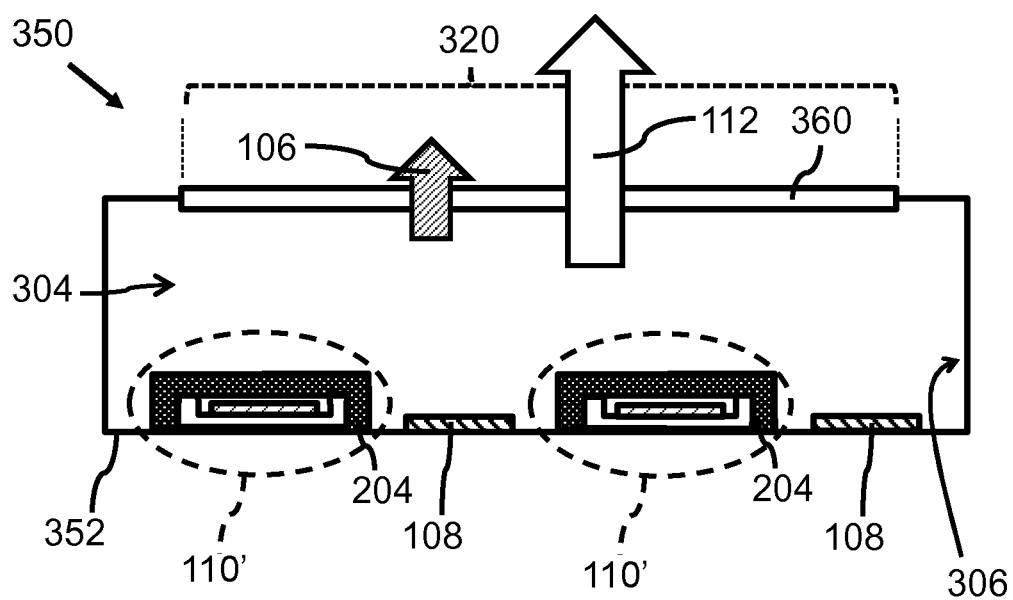

FIG. 3b schematically shows in a cross-sectional view another embodiment of lighting assembly 350 that comprises a light mixing chamber 304 that is enclosed by a housing 352. The housing 352 has a light exit window 320 which, in the embodiment of FIG. 3b, is provided with a transparent plate 360. Other optical elements, like the diffusor 310 of FIG. 3a, may also be used at the light exit window 320. As discussed in the context of FIG. 3a, the inner walls 306 of the housing 352 are light reflective. At an inner wall opposite to the light exit window 320 are provided a plurality of first light source 110' and a plurality of second light sources 108. Embodiments of the second light sources are discussed previously, for example in the context of the embodiments of FIG. 1a to FIG. 3a. The first light sources 110' comprise a solid state light emitter package which are similar to the previously discussed solid state light emitter packages of FIG. 2a and FIG. 2b. Both first light source 110' are enclosed by a UV filter 204 of which possible embodiments have been discussed previously in the context of, for example, the embodiments of FIG. 1a to FIG. 3a. The UV light 106 is emitted by the second light sources 106 into the light mixing chamber 304. Subsequently, after zero, one or more reflections, the UV light 106 is transmitted via the light exit window 320 into the ambient of the lighting assembly 350. The visible light 112 is emitted by the first light sources 110' into the light mixing chamber 304. Subsequently, after zero, one or more reflections, the visible light 112 is transmitted via the light exit window 320 into the ambient of the lighting assembly 350.

FIG. 4a schematically shows in a cross-sectional view a further embodiment of lighting assembly 400 that comprises a light mixing chamber 304. The lighting assembly 400 of FIG. 4a is similar to the lighting assembly 350 of FIG. 3b. One difference is that the first light sources 110' of lighting assembly 350 of FIG. 3b are replaced by a plurality of solid state light emitter packages 410, 411, 412 which each have a solid state light emitter that emits a specific color of light. As shown in FIG. 4a, the different solid state light emitters of the solid state light emitter packages 410, 411, 412 emit red light R, green light G and blue light B, respectively. The solid state light emitter package 410, 411, 412 together form the first light source which is capable of emitting in at least one operational mode the visible light having a color point that is not further away than 25 SDCM from the black body line (in the CIEXYZ color space). The lighting assembly may receive (not shown) control signals which indicate at which light intensity each one of the solid state light emitter packages 410, 411, 412 has to emit and the controller generating the control signals must be able to generate control signals that result in the combined light emission of red light R, green light G and blue light B that has a combined color point within 25 SDCM from the black body line in the CIEXYZ color space. The different colors of light R, G, B are emitted into the light mixing chamber 304 and are mixed by the light mixing chamber to obtain a relatively uniform visible light output through the light exit window 320. When the control signals indicate that the combined light emission must be relatively white light, the visible light output through the light exit window is the white light W.

The lighting assembly 400 also comprises a plurality of second light sources 108 which are arranged at an inner wall of the housing 402 that is adjacent to the light exit window 320. In operation, the second light sources 108 emit UV light 106 into the light mixing chamber 304 in a direction away from the light exit window 320. Thus, before the UV light 106 is emitted through the light exit window 320 into the ambient of the lighting assembly 400, the UV light is at least once reflected by the reflective inner walls 306 of housing 402. Thereby the effect of a relatively homogenous UV light output through the light exit window 320 is obtained and it is prevented that relatively high irradiances are transmitted at specific locations through the light exit window 320. Not having such irradiance peaks is relatively safe, in particular in misuse situations.

The solid state light emitter packages 410, 411, 412 are provided with an UV filter 204. Embodiments of UV filters 204 are discussed previously in the context of the embodiments of FIG. 1a to FIG. 3b. As shown in FIG. 4a, the UV light 106 is first emitted into the direction of the reflective inner walls 306 of the housing 402 and, thus, also into the direction of the solid state light emitter package 410, 411, 412. The UV filters 204 protect the solid state light emitter packages 410, 411, 412 from being damaged by the UV light 106. In an embodiment, the UV filter 204 are dichroic mirrors which allow the transmission of the visible light that is generated by the respective solid state light emitter packages 410, 411, 412 and which reflect the UV light 106. In such an embodiment the efficiency of the lighting assembly 400 is kept relatively high.

Figure 5A:
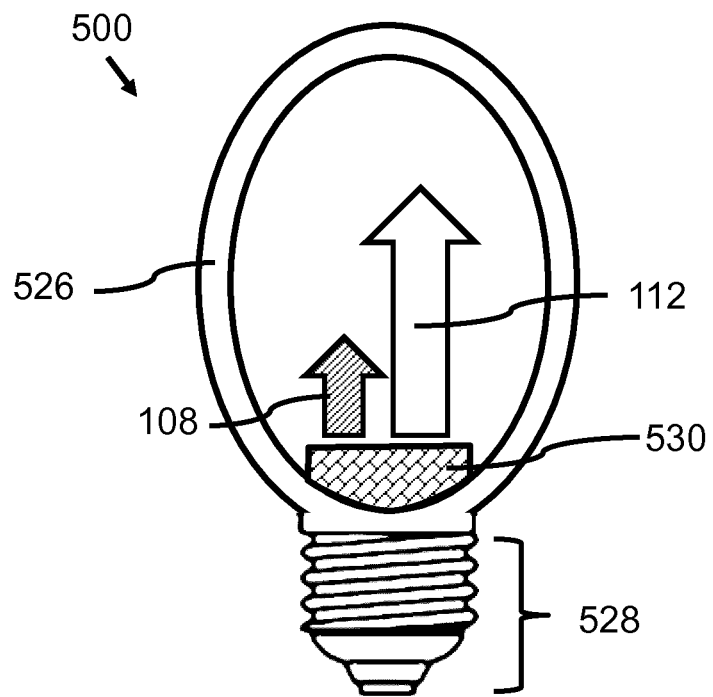

FIG. 5a schematically shows in a cross-sectional view an embodiment of a retrofit light bulb 500. The retrofit light bulb 500 comprises a light transmitting bulb 526 that is provided on a base 528 that allows the retrofit light bulb to connect with a (power-)socket for a lamp in the same way as traditional light bulbs do. In the light transmitting bulb 526 is provided a lighting assembly 530 according to one of the previous discussed embodiments of the lighting assembly. The lighting assembly 530 emits the UV light 108 and the visible light 112 into the interior of the bulb 526 and, subsequently, the UV light 108 and the visible light 112 are emitted through the bulb 526 into the ambient of the retrofit light bulb 500. In FIG. 5a it has been suggested that the lighting assembly 530 is present in the bulb 526 adjacent to the base 528, but other positions may be possible as well. Also it is not necessary that the first light source and the second light source of the lighting assembly are provided in the bulb 526 at a position close to each other. It is, for example, also possible that the first light source is arranged at a position in the bulb 526 opposite to the second light source.

Figure 5B:
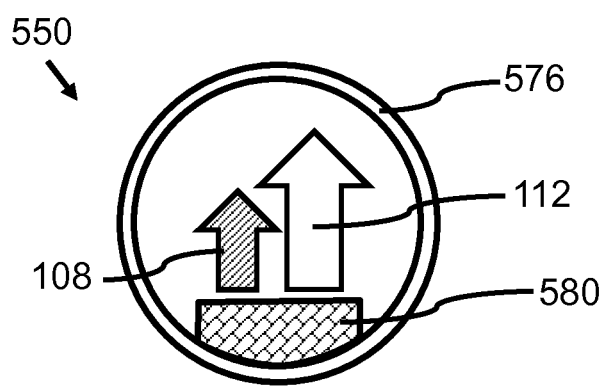

FIG. 5b schematically shows in a cross-sectional view an embodiment of a retrofit light tube 550. The retrofit light tube 550 comprises a light transmitting tube 576 in which a lighting assembly 580 according to previously discussed embodiments is provided. The lighting assembly 580 emits the UV light 108 and the visible light 112 into the interior of the tube 576 and is, subsequently, emitted through the tube 576 into the ambient of the retrofit light tube 550. In FIG. 5b it has been suggested that the first light source and the second light source are arranged at a position relatively close to each other inside the tube 576. The first light source(s) and second light source(s) may also be arranged at spatially separated locations in the longitudinal direction of the tube 576 and/or may be arranged at opposite positions (in the radial direction) inside the tube 576. The retrofit light tube 550 is suitable for use in luminaries that are designed for use with traditional light tubes.

The retrofit light tube 550 and the retrofit light bulb 500 are examples of lamps that comprise the lighting assembly according to previously discussed embodiments.

Figure 6:
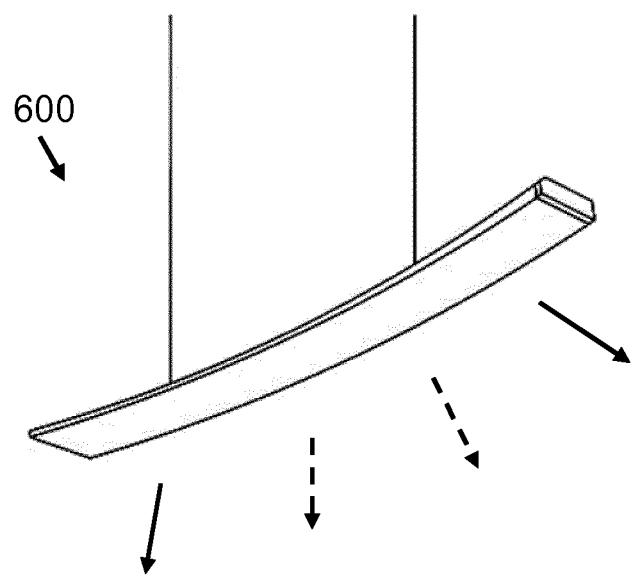

FIG. 6 schematically shows a 3d view of a luminaire 600. The luminaire 600 is provided with a lighting assembly according to one of the previously discussed embodiments of such a lighting assembly, a retrofit light bulb 500 as discussed in the context of FIG. 5a or a retrofit light tube 550 as discussed in the context of FIG. 5b.

In summary, this document provides a lighting assembly, a lamp and a luminaire. The lighting assembly comprises a first light source, a second light source and an UV filter. The first light source emits in operation visible light. The second light source emits in operation UV light. The UV filter allows a transmission of visible light and absorbs or reflects UV light. The UV filter is arranged in an optical path from the second light source towards the first light source to prevent the UV light to impinge on the first light source while allowing the emission of the UV light into the ambient of the lighting assembly.

It will be appreciated that the above description for clarity has described embodiments of the invention with reference to different functional units. However, it will be apparent that any suitable distribution of functionality between different functional units may be used without deviating from the invention. Hence, references to specific functional units are only to be seen as references to suitable means for providing the described functionality rather than indicative of a strict logical or physical structure or organization.

It is noted, that in this document the word 'comprising' does not exclude the presence of other elements or steps than those listed and the word 'a' or 'an' preceding an element does not exclude the presence of a plurality of such elements, that any reference signs do not limit the scope of the claims, and that several 'means' or 'units' may be represented by the same item of hardware. Further, the invention is not limited to the embodiments, and the invention lies in each and every novel feature or combination of features described above or recited in mutually different dependent claims.

The invention claimed is:

1. A lighting assembly for illumination, the lighting assembly comprising:
   a first light source for emitting visible light, the first light source comprising a light emitter and one or more luminescent materials,
   a second light source for emitting UV light,
   an UV filter allowing a transmission of visible light and absorbing or reflecting UV light,
   wherein the UV filter is arranged in an optical path from the second light source towards the first light source.

2. A lighting assembly according to claim 1, wherein the UV filter surrounds or encloses the first light source.

3. A lighting assembly according to claim 1 wherein the first light source comprises a solid state light emitter package comprising a solid state light emitter (210) for emitting the visible light, the solid state light emitter package being enclosed by the UV filter.

4. A lighting assembly according to claim 1 wherein the UV filter allows transmission of oxygen towards the second light source.

5. A lighting assembly according to claim 1 comprising:
   a housing, a light exit window being provided in a wall of the housing for allowing the transmission of the visible light and the UV light into the ambient of the lighting assembly, and a light mixing chamber being provided in the interior of the housing for mixing light emitted by the first light source and the second light source,
   wherein the first light source and the second light source are provided within the light mixing chamber.

6. A lighting assembly according to claim 5, wherein the first light source is arranged on a wall of the light mixing chamber (304) opposite to the light exit window and, one or more surfaces of the first light source not in contact with the wall are provided with the UV filter.

7. A lighting assembly according to claim 5, wherein the second light source is arranged at a position inside the light mixing chamber to prevent direct emission of the UV light through the light exit window.

8. A lighting assembly according to claim 1 at least comprising one of the following:
   a plurality of first light sources,
   a plurality of second light sources, a plurality of UV filters,
wherein, if the lighting assembly comprises a plurality of first light sources.

9. A lighting assembly according claim 1, wherein the first light source is capable of emitting visible light having a color point in the CIE XYZ color space within a distance smaller than 25 SDCM to the black body line in said color space.

10. A lighting assembly according to claim 1, the lighting assembly comprising a light exit window, wherein the lighting assembly is configured to emit, in operation, an amount of the UV light through the light exit window, the amount of the UV light having a first radiant flux and the lighting assembly is configured to emit a second radiant flux of the visible light through the light exit window, a ratio between the first radiant flux and the second radiant flux is in a range from 0.01 to 0.0001.

11. A lighting assembly according to claim 1, wherein the UV light comprising light in a spectral range from 280 nm to 350 nm.

12. A lamp for illumination comprising a lighting assembly according to claim 1.

13. A retrofit light bulb for illumination, the retrofit light bulb comprising a light transmitting bulb and a lighting assembly according to claim 1.

14. A retrofit light tube for illumination, the retrofit light tube comprising a light transmitting tube and a lighting assembly according to claim 1.

15. A luminaire for illumination comprising a lighting assembly according to claim 1.

* * * * *